(12) United States Patent
Wikstroem et al.

(10) Patent No.: US 12,426,349 B2
(45) Date of Patent: Sep. 23, 2025

(54) REVERSE CONDUCTING POWER SEMICONDUCTOR DEVICE AND METHOD FOR MANUFACTURING THE SAME

(71) Applicant: Hitachi Energy Ltd, Zürich (CH)

(72) Inventors: Tobias Wikstroem, Egliswil (CH); Umamaheswara Vemulapati, Windisch (CH)

(73) Assignee: Hitachi Energy Ltd, Zurich (CH)

( * ) Notice: Subject to any disclaimer, the term of this patent is extended or adjusted under 35 U.S.C. 154(b) by 534 days.

(21) Appl. No.: 17/797,218

(22) PCT Filed: Feb. 3, 2021

(86) PCT No.: PCT/EP2021/052514
§ 371 (c)(1),
(2) Date: Aug. 3, 2022

(87) PCT Pub. No.: WO2021/156293
PCT Pub. Date: Aug. 12, 2021

(65) Prior Publication Data
US 2023/0046742 A1    Feb. 16, 2023

(30) Foreign Application Priority Data
Feb. 3, 2020 (EP) .................... 20155140

(51) Int. Cl.
*H10D 84/00* (2025.01)
*H10D 84/01* (2025.01)

(52) U.S. Cl.
CPC ....... *H10D 84/136* (2025.01); *H10D 84/0102* (2025.01)

(58) Field of Classification Search
CPC .......... H01L 29/7416; H01L 29/66371; H01L 29/0646; H01L 29/0657; H01L 29/0692;
(Continued)

(56) References Cited

U.S. PATENT DOCUMENTS 5,682,044 A    10/1997  Tamamushi et al.
6,274,892 B1 *  8/2001  Kub .................... H10D 62/8325
                                                     257/E21.054
(Continued)

FOREIGN PATENT DOCUMENTS

EP    0977271 A2    2/2000
EP    3073530 A1    9/2016
(Continued)

OTHER PUBLICATIONS

Vemulapati, U., et al., "The Concept of Bi-mode Gate Commutated Thyristor", Proceedings of the 2012 24th International Symposium on Power Semiconductor Devices and ICs, Jun. 3-7, 2012, Bruges, Belgium, 4 pages.

*Primary Examiner* — William B Partridge
*Assistant Examiner* — David Paul Sedorook
(74) *Attorney, Agent, or Firm* — Slater Matsil, LLP

(57) ABSTRACT

A reverse conducting power semiconductor device includes a plurality of thyristor cells and a freewheeling diode are integrated in a semiconductor wafer. The freewheeling diode includes a diode anode layer, a diode anode electrode, a diode cathode layer, and a diode cathode electrode. The diode cathode layer includes diode cathode layer segments, each of which is stripe-shaped and arranged within a corresponding stripe-shaped first diode anode layer segment such that a longitudinal main axis of each diode cathode layer segment extends along the longitudinal main axis of the corresponding one of the first diode anode layer segments.

20 Claims, 10 Drawing Sheets

(58) Field of Classification Search
CPC . H01L 29/102; H01L 29/32; H01L 29/42308; H01L 29/8611; H10D 84/136; H10D 84/0102; H10D 8/411; H10D 62/114; H10D 62/117; H10D 62/126; H10D 62/129; H10D 62/206; H10D 62/53; H10D 64/291

See application file for complete search history.

(56) References Cited

U.S. PATENT DOCUMENTS

| | | | |
|---|---|---|---|
| 6,570,193 | B1 | 5/2003 | Koga et al. |
| 2011/0147880 | A1* | 6/2011 | Matthias ............... H10D 62/53 |
| | | | 257/E21.04 |
| 2012/0007142 | A1* | 1/2012 | Nagaoka ................ H10D 8/00 |
| | | | 257/140 |
| 2013/0207157 | A1* | 8/2013 | Rahimo ............. H01L 29/7428 |
| | | | 257/124 |
| 2016/0013302 | A1 | 1/2016 | Rahimo et al. |
| 2017/0033208 | A1* | 2/2017 | Ravener ............... H01L 23/051 |
| 2018/0204913 | A1* | 7/2018 | Arnold .................. H10D 18/65 |

FOREIGN PATENT DOCUMENTS

| | | |
|---|---|---|
| JP | H08186247 A | 7/1996 |
| JP | H08213592 A | 8/1996 |
| JP | 2013543260 A | 11/2013 |
| JP | 2016009871 A | 1/2016 |
| JP | 2016181691 A | 10/2016 |

* cited by examiner

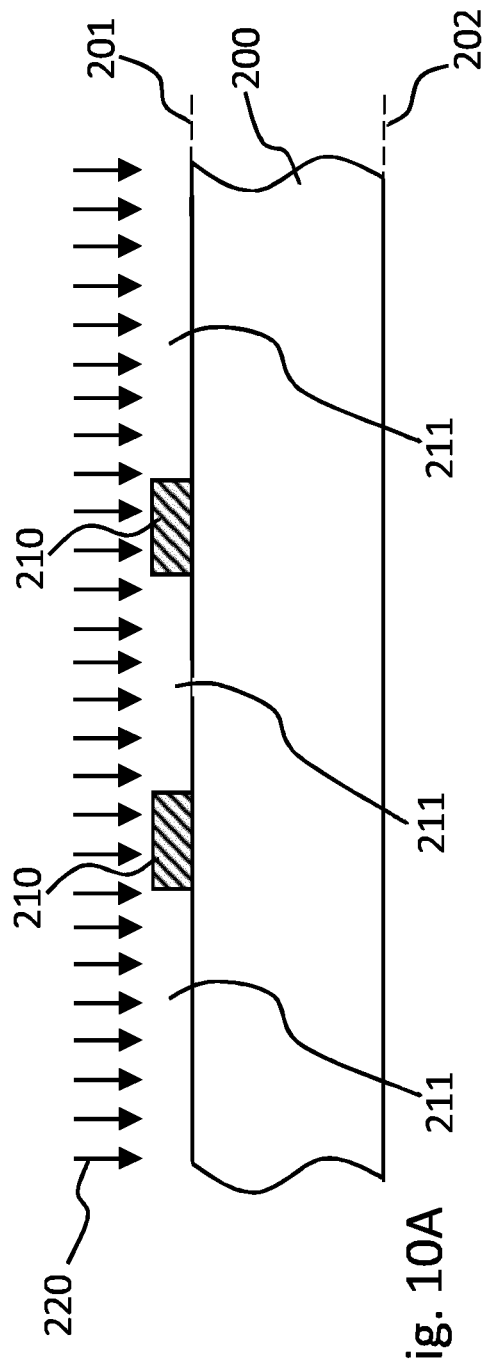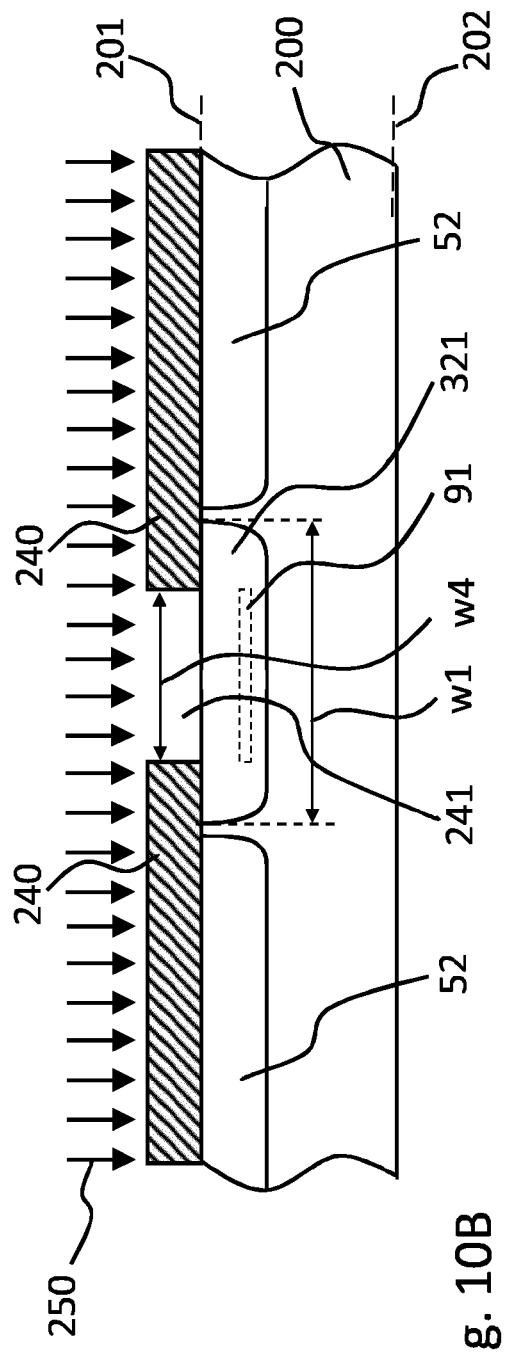

REVERSE CONDUCTING POWER SEMICONDUCTOR DEVICE AND METHOD FOR MANUFACTURING THE SAME

CROSS-REFERENCE TO RELATED APPLICATIONS

This application is a national stage application of International Application No. PCT/EP2021/052514, filed on Feb. 3, 2021, which claims priority to European Patent Application No. 20155140.5, filed on Feb. 3, 2020, which applications are hereby incorporated herein by reference.

TECHNICAL FIELD

The present invention relates to a reverse conducting power semiconductor device and to a method for manufacturing such reverse conducting power semiconductor device.

BACKGROUND

The integrated gate commutated thyristor (IGCT) has been established as the device of choice for many high power applications such as medium voltage drives, STATCOMs, and pumped hydro. Today, IGCTs have been optimized for current source inverter (CSI) and voltage source inverter (VSI) applications with state-of-the-art devices having voltage ratings ranging from 4.5 kV up to 6.5 kV and are today available as asymmetric, symmetric (reverse blocking), and reverse conducting (RC) devices. The integrated gate commutated thyristor (IGCT) is the ideal device of choice for many high-power electronics applications due to its thyristor like conduction and transistor like turn-off.

The reverse conducting integrated gate commutated thyristor (RC-IGCT) is a reverse conducting power semiconductor device that includes within one single semiconductor wafer an IGCT part and a single built-in freewheeling diode part. The diode part includes a p-doped anode layer and an $n^+$-doped cathode layer, which are separated by the $n^-$-doped drift layer and the n-doped buffer layer. The diode part is circular and arranged adjacent to the IGCT part, in top view, in the center of the semiconductor wafer. Between the IGCT part and the diode part there exists an $n^-$-doped separation region which separates the p-doped base layers of the thyristor cells in the IGCT part from the p-doped anode layer of the diode part. In this RC-IGCT, the diode part of the device is optimized with lifetime control to reduce the reverse recovery current peak, thereby decreasing reverse recovery losses and hence protect the diode from high power failures.

The IGCT part of the semiconductor wafer does, however, not make use of any lifetime control. Accordingly, when applying high-energy ion implantation of protons ($H^+$) or helium ions ($He^{2+}$) for generation of recombination centers and thereby form a local lifetime control (LLC) region in the diode part, a metal mask with a thickness of around 0.5 mm (depending on ion energy and mechanical stability of the mask) is used to efficiently block the heavy ions and prevent generation of recombination centers in areas of the IGCT part. In the forward conducting state and in the reverse conducting state only part of the semiconductor wafer is used for the current. Therefore, losses in forward or reverse conducting state are relatively high.

A known reverse conducting power semiconductor device, which was developed to decrease the on-state losses by making use of the whole semiconductor wafer in forward and reverse conducting state, respectively, is the bi-mode gate commutated thyristor (BGCT) as shown in FIGS. 1 and 2. FIG. 1 shows the BGCT in top view and FIG. 2 shows the device in cross-section taken along line c'-c in FIG. 1.

The BGCT comprises in a single semiconductor wafer 1 a plurality of thyristor cells 2 electrically connected in parallel to one another. In the BGCT shown in FIGS. 1 and 2, each of the thyristor cells 2 is made up from three thyristor cathode electrodes 3 in form of a cathode metallization layer, an $n^+$-doped thyristor cathode layer comprising three stripe-shaped thyristor cathode layer segments 4, a p-doped base layer 5, an $n^-$-doped drift layer 6, an n-doped buffer layer 7, a $p^+$-doped thyristor anode layer 8 and a thyristor anode electrode 9 in form of an anode metallization layer. The thyristor cells 2 also each include a gate electrode 10 in form of a gate metallization layer, which is in contact with the p-doped base layer 5. The gate metallization layer is arranged in a plane, which is below the plane, in which the thyristor cathode electrodes 3 are arranged, so that the gate electrodes 10 are vertically separated from the thyristor cathode electrodes 3.

The BGCT includes one single common gate contact 11 in the form of an annular metallic region in the center of the semiconductor wafer 1. The common gate contact 11 is in direct contact with the gate metallization layer, so that the gate contact 11 and the gate electrodes 10 of all thyristor cells 2 are electrically connected with each other. The BGCT comprises a plurality of diode cells 12 distributed between the thyristor cells 2. The diode cells 12 are electrically connected in parallel to one another and to the thyristor cells 2, albeit with opposing forward direction. Each diode cell 12 includes a diode anode electrode 17, a p-doped diode anode layer 13, an $n^+$-doped diode cathode layer 14, and a diode cathode electrode 16, wherein the p-doped diode anode layer 13 and the $n^+$-doped diode cathode layer 14 are separated by the $n^-$-doped drift layer 6 and the n-doped buffer layer 7. Neighboring thyristor cells 2 and diode cells 12 are respectively separated by a separation region 15.

As set out above a metal mask with a thickness of around 0.5 mm is used to selectively form an LLC region in the diode part of a known RC-IGCT (having a single diode part integrated in the same semiconductor wafer together with the IGCT part). However, for a reproducible process the masked structures must be larger than the thickness of the mask. With the common BGCT layout, the width of the diode cells is in the same order or smaller than the required thickness of the metal mask. Also, for forming the LLC region implantation of heavy ions has to be carried out at an inclination angle of 7° to the surface normal in order to avoid channeling. Therefore, the implantation of heavy ions is offset from the diode segment even at perfect alignment and avoiding implantation into the GCT regions becomes more critical.

Therefore, excluding LLC was judged as a prerequisite in the BGCT due to the fine details of the layout of the BGCT. The concept of the Emitter Controlled (EMCON) diode was considered for the development of the BGCT classic design. It requires, however, different junction depths for diode-parts (p-n junction between p-doped diode anode layer 13 and $n^-$-doped drift layer 6 in FIG. 2) and GCT-parts (p-n junction between p-doped base layer 5 and $n^-$-doped drift layer 6 in FIG. 2) in order to keep the diode anode emitter efficiency low. On the other side, diode robustness is weak if the diode parts and the GCT-parts have different blocking junction depths.

From US 2018/204913 A1 it is known a turn-off power semiconductor device comprising a plurality of thyristor cells. Each thyristor cell comprises a cathode region, a base layer, a drift layer, an anode layer, a gate electrode which is arranged lateral to the cathode region in contact with the base layer, a cathode electrode, and an anode electrode. Interfaces between the cathode regions and the cathode electrodes as well as interfaces between the base layers and the gate electrodes of the plurality of thyristor cells are flat and coplanar. In addition, the base layer includes a gate well region extending from its contact with the gate electrode to a depth, which is at least half of the depth of the cathode region, wherein, for any depth, the minimum doping concentration of the gate well region at this depth is 50% above a doping concentration of the base layer between the cathode region and the gate well region at this depth and at a lateral position, which has in an orthogonal projection onto a plane parallel to the first main side a distance of 2 µm from the cathode region. The base layer includes a compensated region of the second conductivity type, the compensated region being arranged directly adjacent to the first main side and between the cathode region and the gate well region, wherein the density of first conductivity type impurities relative to the net doping concentration in the compensated region is at least 0.4.

The above described BGCT is disclosed and discussed for example in the publication "The Concept of Bi-mode Gate Commutated Thyristor" by Umamaheswara Vemulapati and Marco Bellini in Proceedings of the 2012 24$^{th}$ International Symposium on Power Semiconductor Devices and ICs 3-7 Jun. 2012, Bruges, Belgium, pages 29-32.

From US 2016/013302 A1 it is known a reverse-conducting power semiconductor device with a wafer having a first and a second main side, which are arranged opposite and parallel to each other. The device includes a plurality of diode cells and a plurality of gate commutated thyristors (GCT) cells. Each GCT cell includes layers of a first conductivity type (e.g., n-type) and a second conductivity type (e.g., p-type) between the first and second main sides. The device includes at least one mixed part in which diode anode layers of the diode cells alternate with first cathode layers of the GCT cells. In each diode cell, a diode buffer layer of the first conductivity type is arranged between the diode anode layer and a drift layer such that the diode buffer layer covers lateral sides of the diode anode layer from the first main side to a depth of approximately 90% of the thickness of the diode anode layer.

From U.S. Pat. No. 5,682,044 A it is known a reverse conducting (RC) thyristor of a planar-gate structure for low-and-medium power use, which is relatively simple in construction because of employing a planar structure for each of thyristor and diode regions, permits simultaneous formation of the both region and have high-speed performance and a RC thyristor of a buried-gate or recessed-gate structure which has a high breakdown voltage by the use of a buried-gate or recessed-gate structure, permits simultaneous formation of thyristor and diode regions and high-speed, high current switching performance, and the RC thyristor of the planar-gate structure has a construction which comprises a static induction (SI) thyristor or miniaturized GTO of a planar-gate structure in the thyristor region and an SI diode of a planar structure in the diode region, the diode region having at its cathode side a Schottky contact between n emitters or diode cathode shorted region and the thyristor region having at its anode side an SI anode shorted structure formed by (p+) anode layers, wave-shaped anode layers or anode (n+) layers; in the case of a high breakdown device, an n buffer layer is added; similarly the RC thyristor of the buried-gate or recessed-gate structure has a construction which comprises an SI thyristor of a buried-gate or recessed-gate structure at the thyristor region and an SI diode of the buried or recessed structure.

SUMMARY

Embodiments of the invention can provide a reverse conducting power semiconductor device, which can overcome some or all of the above-described problems in the prior art. Particular embodiments of the invention can provide a reverse conducting power semiconductor device, in which forward conduction losses and switching conduction losses can be kept low at the same time while ensuring a good thermal performance.

BRIEF DESCRIPTION OF THE DRAWINGS

Detailed embodiments of the invention will be explained below with reference to the accompanying figures, in which:

FIGS. 10A and 10B illustrate method steps for manufacturing the reverse conducting power semiconductor device according to an embodiment of the invention.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF ILLUSTRATIVE EMBODIMENTS

Figure 1:
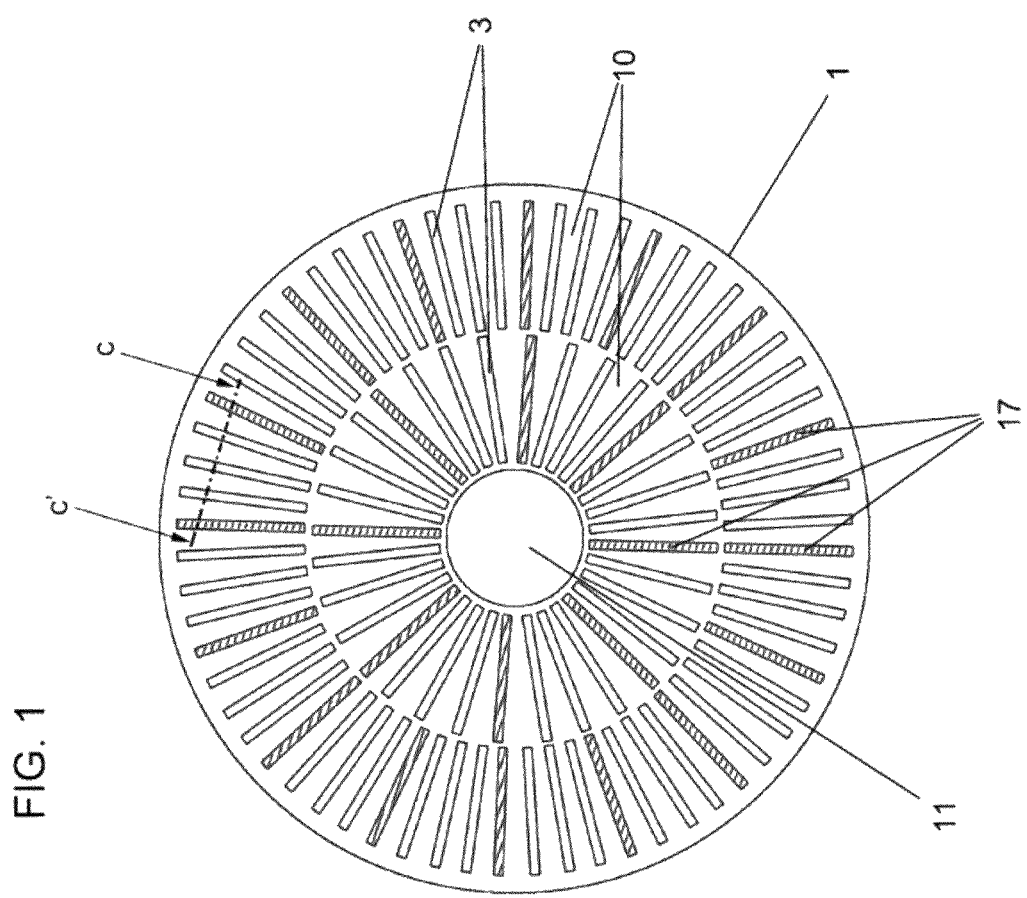
FIG. 1 shows a top view onto a bi-mode gate commutated thyristor (BGCT), which is a known turn-off power semiconductor device.
Figure 2:
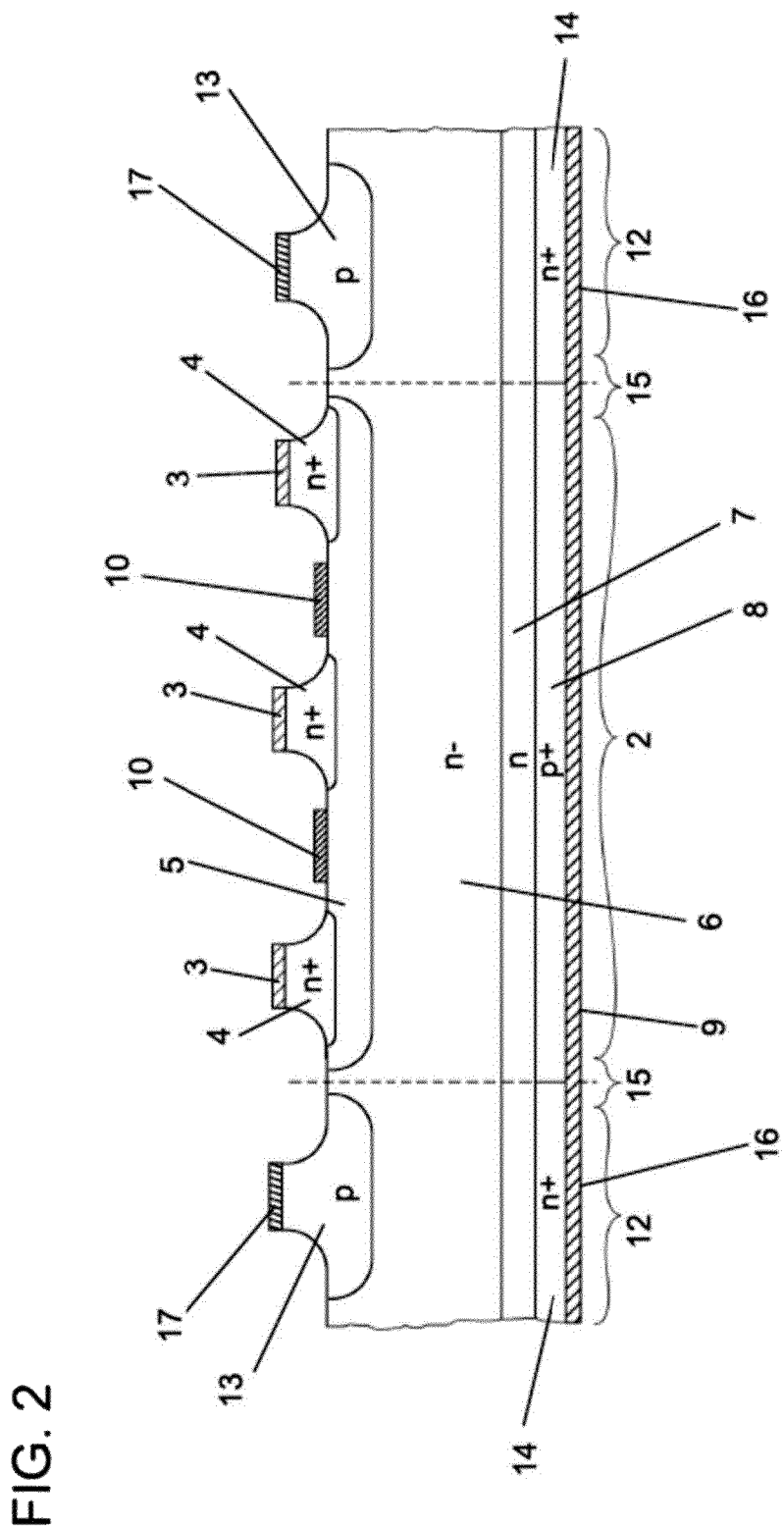
FIG. 2 shows a cross-section of the BGCT taken along line c'-c in FIG. 1.

A reverse conducting power semiconductor device according to an embodiment of the invention comprises a plurality of thyristor cells and a freewheeling diode integrated in a semiconductor wafer having a first main side and a second main side opposite to the first main side. Each of the plurality of thyristor cells comprises, in an order from a first main side to the second main side, a thyristor cathode layer of a first conductivity type, a base layer of a second conductivity type different from the first conductivity type (wherein a first p-n junction is formed between the base layer and the thyristor cathode layer), a drift layer of the first conductivity type forming a second p-n junction with the base layer, and a thyristor anode layer of the second conductivity type separated from the base layer by the drift layer.

Each thyristor cell further comprises a gate electrode which is arranged lateral to the thyristor cathode layer and forms an ohmic contact with the base layer, a thyristor cathode electrode arranged on the first main side and forming an ohmic contact with the thyristor cathode layer, and a thyristor anode electrode arranged on the second main side and forming an ohmic contact with the thyristor anode layer.

The freewheeling diode comprises, at the first main side, a diode anode layer of the second conductivity type, which forms a third p-n junction with the drift layer and which is separated from the base layer by the drift layer. On the first main side, a diode anode electrode is electrically connected to the diode anode layer and, at the second main side, a diode cathode layer of the first conductivity type is electrically connected to the drift layer. On the second main side a diode anode electrode forms an ohmic contact with the diode cathode layer. The diode anode layer comprises plural first diode anode layer segments that are stripe-shaped in an orthogonal projection onto a plane parallel to the second main side. A longitudinal main axis of each first diode anode layer segment extending in a lateral direction away from a lateral center of the semiconductor wafer. The first lateral width of each first diode anode layer segment in a plane parallel to the second main side and in a direction perpendicular to its longitudinal main axis is at any position along the longitudinal main axis at least 1000 μm, or at least 1200 μm. That means that a minimal lateral width of each first diode anode layer segment is at least 1000 μm, or at least 1200 μm.

Throughout the specification, lateral refers to a direction parallel to the second main side, and a lateral center of the semiconductor wafer is determined as a center in the plane parallel to the second main side. Also, throughout the specification, a center of an area is to be understood as the centroid, i.e., as the arithmetic mean position of all the points in the area. Also, throughout the specification, a stripe-shaped element is defined as any element having a width in a predetermined longitudinal direction, which is larger than in any other direction, wherein the width in the predetermined longitudinal direction is at least twice a width along any line perpendicular to the predetermined longitudinal direction. A longitudinal main axis of the stripe-shaped element extends along the predetermined longitudinal direction.

In the reverse conducting power semiconductor device of the invention implementing the freewheeling diode with the plural stripe-shaped first diode anode layer segments ensures a good thermal and electrical current spreading within the semiconductor wafer. Further, the segmentation of the freewheeling diode results in a less snappy behavior thereof, which in turn allows to reduce to the thickness of the semiconductor wafer resulting in decreased losses in reverse and in forward conduction state. The lower limit for the first lateral width of the stripe-shaped first diode anode layer segments results in lower forward conduction losses compared to the known BGCT. This can be explained by minimizing conductivity modulation due to reduced current spreading. Even with the high lower limit of the first lateral width of the stripe-shaped first diode anode layer segments, which is significantly higher than in the known BGCT, the thermal spreading is still efficient due to the stripe-shape and the reverse conducting power semiconductor device exhibits good surge current capability.

The reverse conducting power semiconductor device of the invention comprises plural local lifetime control regions including radiation induced recombination centers, wherein each local lifetime control region is in an orthogonal projection onto a plane parallel to the second main side stripe-shaped and is in the orthogonal projection arranged within a corresponding one of the first diode anode layer segments such that a longitudinal main axis of each local lifetime control region extends along the longitudinal main axis of the corresponding one of the first diode anode layer segments, and each local lifetime control region has a second lateral width which is at least 200 μm or at least 300 μm less than the first lateral width of the corresponding one of the first diode anode layer segments. Exemplarily, the second lateral width is at least 200 μm or at least 300 μm less than the first lateral width of the corresponding one of the first diode anode layer segments in each vertical cross section along a plane orthogonal to the second main side and orthogonal to the longitudinal main axis of the corresponding one of the first diode anode layer segments.

In the reverse conducting power semiconductor device of the invention a relatively high carrier lifetime at the edges of the drift layer portion in the stripe-shaped diode parts (portions of the semiconductor wafer that overlap in orthogonal projection on a plane parallel to the second main side with the stripe-shaped first diode anode layer segments) leads to injection of much more charge there than in the central part of the stripe-shaped diode parts. Therein a central part refers to a part which is central regarding a direction perpendicular to the longitudinal main axis and parallel to the second main side).

As the diode is recovering, the p-n junction in the proton implanted region is cleared quickly, as there is less charge there. This starts the transfer of voltage from the switch and other circuit elements like a choke, to the diode. The appearance of diode voltage slows down the current rate of change and the diode reverse recovery peak current Irr is reached at a comparable level as if the diode had been irradiated to the full width of the first diode anode layer segments. The charge mountain at the edge of the diode is still there. The electrons travel downward, in the general direction of higher voltage. As they are laterally displaced to the n+ diode cathode layer, they must flow laterally to reach it. Obviously, this is a situation where the well-known field charge extraction (FCE) effect can come into effect. That means that in such exemplary embodiment, the freewheeling diode is a FCE diode that is enhanced by lifetime segmentation. The mountain of charge carriers gets an optimal lateral placement while the low-lifetime region ensures a reasonable diode reverse recovery peak current Irr. This results in a soft recovery of the freewheeling diode.

In this embodiment of the invention, the diode cathode layer comprises plural diode cathode layer segments. Each diode cathode layer segment is in the orthogonal projection onto the plane parallel to the second main side stripe-shaped and is in this orthogonal projection arranged within a corresponding one of the stripe-shaped first diode anode layer segments such that a longitudinal main axis of each diode cathode layer segment extends along the longitudinal main axis of the corresponding one of the first diode anode layer segments. Each diode cathode layer segment has a third lateral width which is at least 200 μm or at least 300 μm less than the second lateral width of a corresponding one of the local lifetime control regions. The corresponding one of the local lifetime control regions is arranged within the corresponding one of the first diode anode layer segments in the orthogonal projection onto the plane parallel to the second main side.

In such exemplary embodiment, the FCE effect during reverse recovery of the freewheeling diode is more pronounced, resulting in a soft recovery and less snappy behavior of the freewheeling diode. Exemplarily, the third lateral width is at least 200 µm or at least 300 µm less than the second lateral width of a corresponding one of the local lifetime control regions in each vertical cross section along a plane orthogonal to the second main side and orthogonal to the longitudinal main axis of the corresponding one of the first diode anode layer segments. In an exemplary embodiment, the semiconductor wafer has a circular shape and the longitudinal main axis of each first diode anode layer segment extends along a radial direction of this circular shape.

In an exemplary embodiment, the first lateral width of each first diode anode layer segment is at any position along its longitudinal main axis less than 5000 µm or less than 4000 µm or less than 3000 µm. That means that a maximum of the first lateral width is less than 5000 µm or less than 4000 µm or less than 3000 µm.

In an exemplary embodiment, in the orthogonal projection onto the plane parallel to the second main side, in the lateral center of the semiconductor wafer a circular shaped portion of the freewheeling diode is arranged. In such arrangement most efficient use is made of the available semiconductor wafer area. In this exemplary embodiment, each first diode anode layer segment may laterally extend from the circular-shaped portion of the freewheeling diode.

In an exemplary embodiment a length of each first diode anode layer segment in a direction along its longitudinal main axis is at least 20% or at least 25% of a width of the semiconductor wafer in this direction. With such relatively long stripe-shaped first diode anode layer segments the thermal performance is improved due to efficient thermal spreading of heat generated in the freewheeling diode.

In an exemplary embodiment, the diode anode layer comprises stripe-shaped second diode anode layer segments that extend along radial directions that are arranged laterally between two adjacent first diode anode layer segments, respectively, a distance between each second diode anode layer segment and the lateral center of the semiconductor wafer being larger than a distance between each first diode anode layer segment and the lateral center of the semiconductor wafer. In such exemplary embodiment a variation of a distance between neighboring stripe-shaped diode anode layer segments may be reduced and thermal spreading is enhanced.

In an exemplary embodiment, the minimum of the first lateral width of each first diode anode layer segment is less than 2000 µm. With such parameter the thermal performance is improved and the freewheeling diode exhibits less snappy behavior than in the known RC-IGCT.

In an exemplary embodiment, the third lateral width is at least 600 µm less or at least 800 µm less than the first lateral width of the corresponding one of the first diode anode layer segments. In such exemplary embodiment the FCE effect during reverse recovery of the freewheeling diode is more pronounced, resulting in soft recovery and less snappy behavior of the freewheeling diode. Exemplarily, the third lateral width is at least 600 µm less or at least 800 µm less than the first lateral width of the corresponding one of the first diode anode layer segments in each vertical cross section along a plane orthogonal to the second main side and orthogonal to the longitudinal main axis of the corresponding one of the first diode anode layer segments.

In an exemplary embodiment, a depth of each base layer and a depth of the diode anode layer are the same. In such exemplary embodiment the diode robustness is improved compared to a known BGCT with different junction depth of diode (i.e., the depth of the diode anode layer) and GCT parts (i.e., depth of the base layer). Also, in such exemplary embodiment the base layer and the diode anode layer can be formed in the same process step simultaneously. Therefore, the manufacturing of the reverse conducting power semiconductor device is facilitated.

In an exemplary embodiment, the gate electrodes of the plurality of thyristor cells are electrically connected with each other, and the device further comprises a common gate contact for contacting the gate electrodes of the plurality of thyristor cells, wherein the common gate contact is arranged on a circumferential edge of the semiconductor wafer on the first main side.

In an exemplary embodiment, the thyristor cathode layer comprises plural separate thyristor cathode layer segments that are at least partially surrounded in a plane parallel to the first main side by a gate metallization layer forming the plurality of gate electrodes and connections there between. In the latter exemplary embodiment, the thyristor cathode layer segments of the plurality of thyristor cells may be arranged at the first main side as stripes placed in concentric rings around the lateral center of the semiconductor wafer, the longitudinal main axis of each stripe extending along a radial direction which is a direction extending from the lateral center of the semiconductor wafer and parallel to the first main side. In this exemplary embodiment fast commutation of the conduction current from the cathode to the gate is facilitated.

Reference will now be made to the figures.

Figure 3:
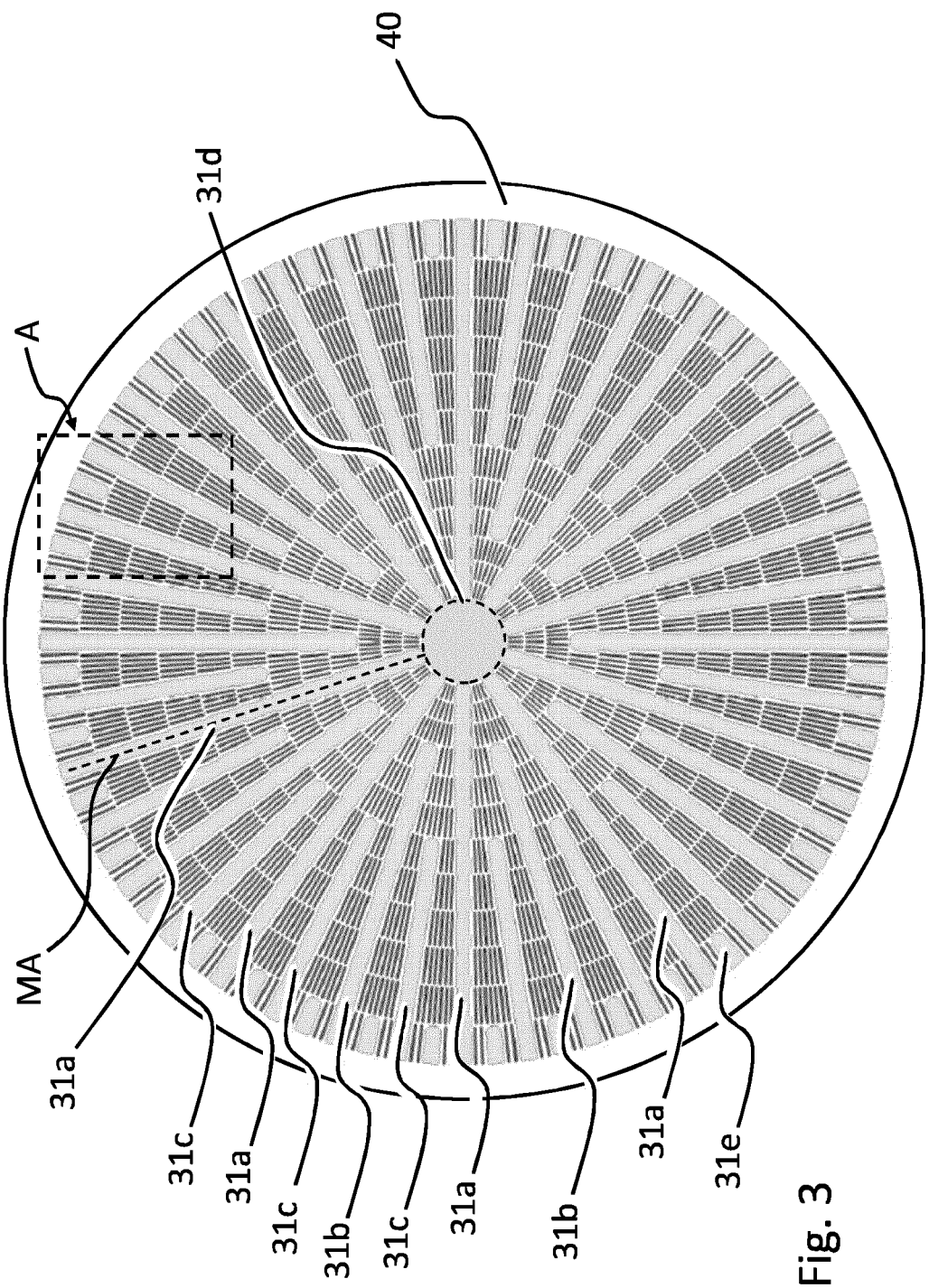
FIG. 3 shows a top view onto a reverse conducting power semiconductor device according to an embodiment of the invention.
Figure 4:
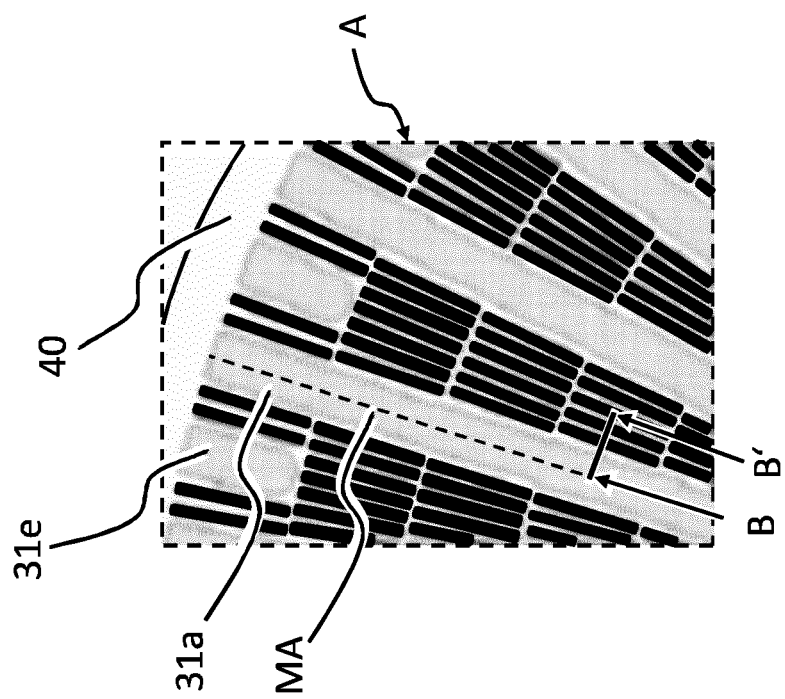
FIG. 4 shows an enlarged portion A of the top view of FIG. 3.

In the following a reverse conducting power semiconductor device according to a first embodiment of the invention is described with reference to FIGS. 3 to 6. FIG. 3 shows a top view onto the reverse conducting power semiconductor device, FIG. 4 shows an enlarged portion A of the top view of FIG. 3, FIG. 5 shows a partial vertical cross-section along line B-B' in FIG. 4, and FIG. 6 shows an orthogonal projection of a part of the reverse conducting power semiconductor device onto a horizontal plane.

Figure 5:
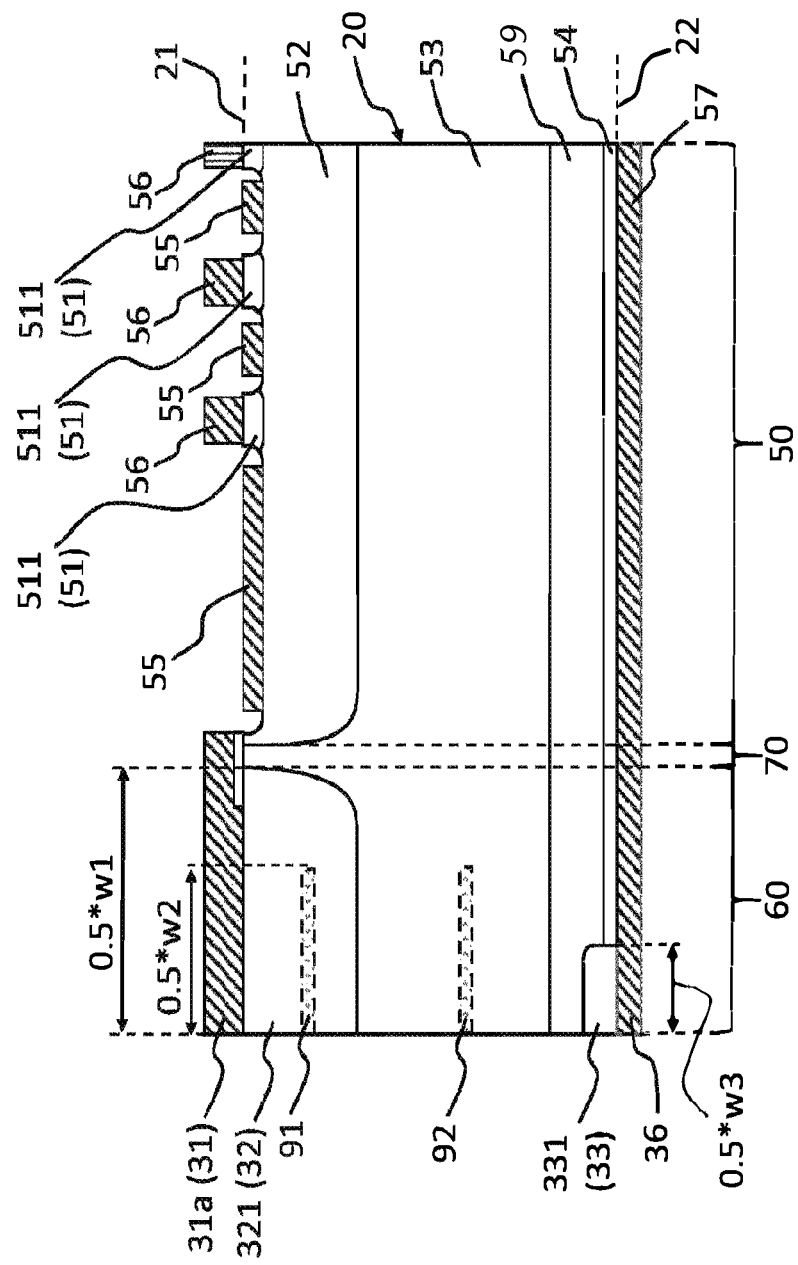
FIG. 5 shows a partial vertical cross-section along line B-B' in FIG. 4.
Figure 6:
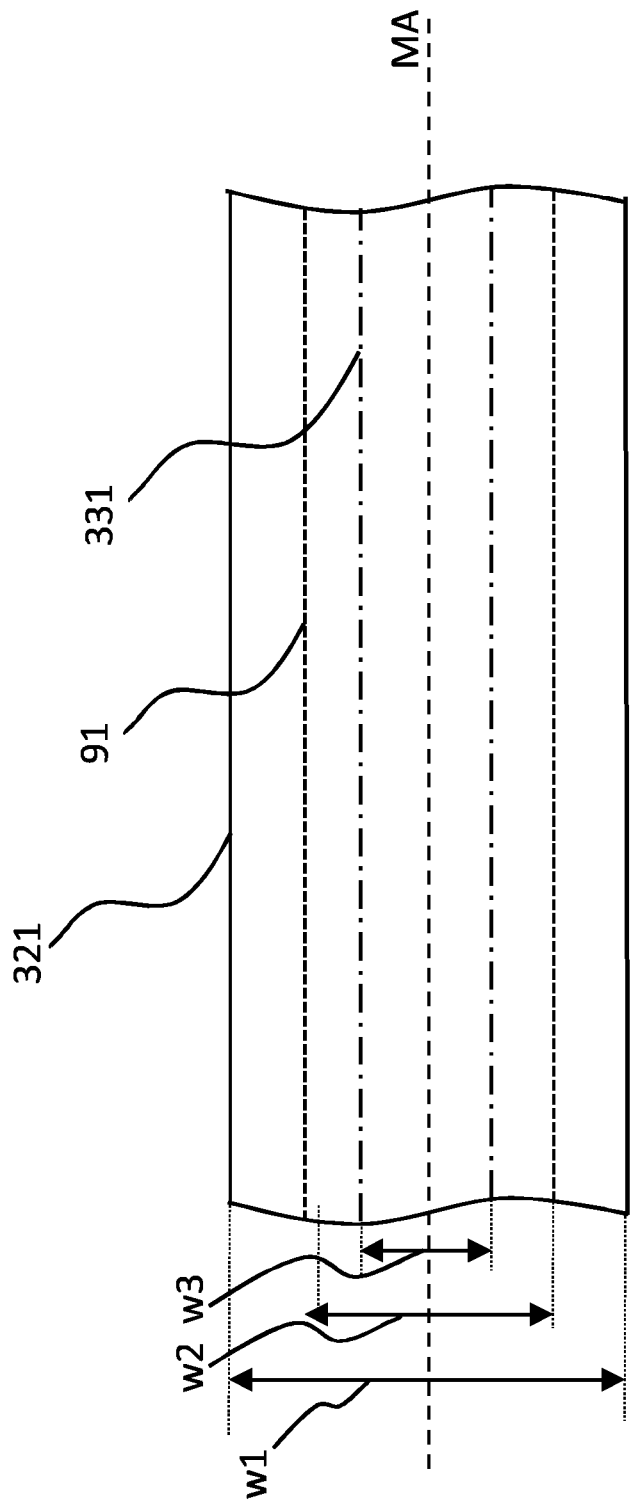
FIG. 6 shows an orthogonal projection of a stripe-shaped freewheeling diode part of the reverse conducting power semiconductor device of FIG. 3 onto a horizontal plane.

As shown in FIG. 5, the reverse conducting power semiconductor device according to the first embodiment comprises a semiconductor wafer 20 having a first main side 21 and a second main side 22. A plurality of thyristor cells 50 and a freewheeling diode 60 are integrated in the semiconductor wafer 20. Each thyristor cell 50 comprises, in the order from the first main side 21 to the second main side 22, an n-type thyristor cathode layer 51. a p-type base layer 52, an n-type drift layer 53, an n-type buffer layer 59, and a p-type thyristor anode layer 54 which is separated from the base layer 52 by the drift layer 53. A first p-n-junction is formed between the base layer 52 and the thyristor cathode layer 51 and a second p-n-junction is formed between the base layer 52 and the n-type drift layer 53.

Therein the buffer layer 59 is optional and has a doping concentration higher than that of the drift layer 53. Each thyristor cell 50 further comprises a gate electrode 55, which is arranged lateral to the thyristor cathode layer 51 and forms an ohmic contact with the base layer 52, a thyristor cathode electrode 56 arranged on the first main side 21 and forming an ohmic contact with the thyristor cathode layer 51, and a thyristor anode electrode 57 arranged on the second main side 22 and forming an ohmic contact with the thyristor anode layer 54.

The freewheeling diode 60 integrated in the semiconductor wafer 20 comprises, at the first main side 21, a p-type diode anode layer 32. The diode anode layer 32 forms a third p-n-junction with the drift layer 53 and which is separated from the base layer 52 by the drift layer 53. On the first main side 21, a diode anode electrode 31 is electrically connected to the diode anode layer 32. At the second main side 22, an n-type diode cathode layer 33 is electrically connected to the drift layer 53 through the buffer layer 55. On the second main side 22, a diode cathode electrode 36 forms an ohmic contact with the diode cathode layer 33.

Throughout the specification, if two semiconductor regions of the same conductivity type are described to be electrically connected it shall mean that these two semiconductor regions are either in direct contact or are connected to each other by one or more semiconductor regions of the same conductivity type or are connected to each other by a metal.

The base layers 52 of thyristor cells 50 are separated from the diode anode layer 32 by a separation region 70 comprising at least a portion of the drift layer 53.

The diode anode layer 32 comprises plural first diode anode layer segments 321 which correspond in the top view of FIG. 3 and in the partial top view of FIG. 4 to stripe-shaped portions 31a of the diode anode electrode 31 extending on the first main side 21 on first diode anode layer segments 321. In FIGS. 3 and 4 the diode anode electrode 31 is shown in light gray color. As indicated in FIGS. 3 and 4, each first diode anode layer segment 321 has a longitudinal main axis MA extending in a direction away from a lateral center of the semiconductor wafer 20. Therein, the longitudinal main axis MA may be defined as a direction, in which the first diode anode layer segment 321 has its largest extension. In an exemplary embodiment, the longitudinal main axis MA forms an axis of symmetry of the first diode anode layer segment 321 in top view (i.e., in an orthogonal projection onto a plane parallel to the second main side 22) with regard to reflection (i.e., the projection of the first diode anode layer segment 321 has mirror symmetry relative to the longitudinal main axis MA).

In the first embodiment the semiconductor wafer 20 has a circular shape and the longitudinal main axis MA of each first diode anode layer segment 321 extends along a radial direction from the lateral center of the circular shaped semiconductor wafer 20.

The stripe-shaped first diode anode layer segment 321 has, in a vertical cross-section along a plane perpendicular to the second main side 22 and perpendicular to the longitudinal main axis MA of the first diode anode layer segment 321, a first lateral width w1. It is to be mentioned that in FIG. 5 only half of the stripe-shaped portion of the freewheeling diode 60, which corresponds to the first diode anode layer segment 321, is shown. Therefore, a width 0.5×w1 of the first diode anode layer segment 321 is indicated in FIG. 5. The first lateral width w1 of the first diode anode layer segment 321 may vary along the longitudinal main axis MA of the first diode anode layer segment 321.

In the invention, the first lateral width w1 of each first diode anode layer segment 321 in a direction perpendicular to its longitudinal main axis MA is at any position along the longitudinal main axis MA at least 1000 µm or at least 1200 µm (i.e., a minimum of the first lateral width w1 is at least 1000 µm or at least 1200 µm). A maximum of the first lateral width w1 of each first diode anode layer segment 321 may be less than 5 times the minimal lateral width or less than four times the minimal lateral width of that first diode anode layer segment 321. For example, the first lateral width w1 of each first diode anode layer segment 321 may be at any position along the longitudinal axis less than 5000 µm or less than 4000 µm or less than 3000 µm (i.e., a maximum of the first lateral width is less than 5000 µm or less than 4000 µm or less than 3000 µm). In an exemplary embodiment the minimum of the first lateral width w1 of each first diode anode layer segment 321 in the direction perpendicular to its longitudinal main axis MA is less than 2000 µm, so that the minimum of the first lateral width w1 is in a range between 1000 µm and 2000 µm or in a range between 1200 µm and 2000 µm.

A length of each first diode anode layer segment 321 in a direction along its longitudinal main axis MA is exemplarily as shown in FIG. 3 at least 20% or at least 25% of a width or diameter of the semiconductor wafer 20 in this direction.

A depth of each base layer 52 and a depth of the diode anode layer 32 are exemplarily the same as shown in FIG. 4.

The reverse conducting power semiconductor device according to the first embodiment comprises in addition plural local life time control regions 91 in an area close to the p-n-junction between first diode anode layer segments 321 and drift layer 53. Each local life time control region 91 includes radiation induced recombination centers. In an orthogonal projection onto a plane parallel to the second main side 22 each local life time control region 91 is stripe-shaped and is arranged within a corresponding one of the first diode anode layer segments 321 in such orthogonal projection, such that a longitudinal main axis of each local life time control region 91 extends along the longitudinal main axis MA of one of the first diode anode layer segments 321 in the orthogonal projection. That means that each local life time control region 91 and the corresponding first diode anode layer segment 321 share the same longitudinal main axis MA. Exemplarily the local life time control region 91 has mirror symmetry with the longitudinal main axis MA as an axis of symmetry regarding reflection like the corresponding first diode anode layer segment 321.

As shown in FIG. 5, each local life time control region 91 has in each vertical cross-section along a plane orthogonal to the second main side 22 and orthogonal to the longitudinal main axis MA of the corresponding one of the first diode anode layer segment 321 a second lateral width w2 which is at least 200 µm or at least 300 µm less than the first lateral width w1 of the corresponding one of the first diode anode layer segment 321 in this vertical cross-section.

In addition to the local life time control regions 91 there may be arranged (optional) additional second local life time control regions 92 at a larger depth in the drift layer 53 as shown in FIG. 5. A lateral width of such additional second local life time control region 92 may be the same as that of the local life time control regions 91.

Referring to FIG. 5, the diode cathode layer 33 comprises plural diode cathode layer segments 331, wherein each diode cathode layer segment 331 is in the orthogonal projection onto a plane parallel to the second main side 22 stripe-shaped and is in this orthogonal projection arranged within a corresponding one of the stripe-shaped first diode anode layer segments 321 such that a longitudinal main axis of each diode cathode layer segment 331 extends along the longitudinal main axis MA of the corresponding one of the first diode anode layer segments 321. That means that each diode cathode layer segment 331 and the corresponding first diode anode layer segment 321 share the same longitudinal main axis MA. Exemplarily each diode cathode layer segment 331 has mirror symmetry with the longitudinal main axis MA as an axis of symmetry regarding reflection similar to the mirror symmetry of the corresponding first diode anode layer segment 321.

Each diode cathode layer segment 331 has in each vertical cross section along a plane orthogonal to the second main side 22 and orthogonal to the longitudinal main axis MA of the corresponding one of the first diode anode layer segments 321, a third lateral width w3 which is at least 200 µm or at least 300 µm less than the second lateral width w2 of a corresponding one of the local lifetime control regions 91 in this cross section, wherein the corresponding one of the local lifetime control regions 91 is arranged within the corresponding one of the first diode anode layer segments 321 in the orthogonal projection onto the plane parallel to the second main side 22.

That means that the following relation (1) is satisfied:

$$w1 > w2 > w3 \quad (1)$$

This relation is illustrated in FIG. 6, which shows a top view (orthogonal projection onto a plane parallel to the second main side 22) of a section of a first diode anode layer segment 321, a corresponding section of a corresponding lifetime control region 91 and a section of a corresponding diode cathode layer segment 331 which overlap with each other in this orthogonal projection. In the section illustrated in FIG. 6 the first lateral width w1, the second lateral width w2 and the third lateral width w3 are shown to be constant. However, as set out above, these lateral widths w1, w2 and w3 may vary along the longitudinal main axis MA within limits set out above. Each first diode anode layer segment 321, the corresponding lifetime control region 91, the corresponding diode cathode layer segment 331 and finger portion 31a of diode anode electrode 31 correspond to a stripe-shaped portion of the freewheeling diode 60.

Alternatively or in addition to the above indicated relation between w3 and w2, each diode cathode layer segment 331 may have, in each vertical cross section along a plane orthogonal to the second main side 22 and orthogonal to the longitudinal main axis MA of the corresponding one of the first diode anode layer segments 321 a third lateral width w3 which is at least 600 µm less or at least 800 µm less than the first lateral width w1 of the corresponding one of the first diode anode layer segments 321 in this cross section.

As can be seen further from the top view in FIG. 3, the diode anode electrode 31 comprises, besides the first finger portions 31a corresponding to the first diode anode layer segments 321, second finger portions 31b and third finger portions 31c. In the first embodiment a longitudinal main axis of all these finger portions 31a, 31b and 31c extends from a lateral center of the semiconductor wafer 20 in a radial direction.

In the lateral center of the reverse conducting power semiconductor device the diode anode electrode 31 comprises a circular shaped portion 31d, from which the first finger portions 31a extend in the radial direction. The second finger portion 31b extend in the radial direction between two neighboring first finger portions 31a, respectively. The second finger portions 31b are shorter than the first finger portions 31a and are separated from the circular portion 31d. Third finger portions 31c extend in the radial direction between a first finger portion 31a and a closest second finger portion 31b. Third finger portions 31c are shorter than the first finger portions 31a and also shorter than the second finger portions 31b. Third finger portions 31c are separated from the circular portion 31d by a larger distance than the second finger portions 31b.

Finally, fourth finger portions 31e are arranged between each pair of directly neighboring first to third finger portions 31a to 31c at a circumferential edge of the semiconductor wafer 20. As discussed above, each first finger portion 31a corresponds to a first diode anode layer segment 321 and have each a longitudinal main axis extending, in an orthogonal projection onto a plane parallel to the second main side 22, along the longitudinal main axis MA of a corresponding one of the first diode anode layer segments 321. Likewise the second, third and fourth finger portions 31b, 31c and 31e correspond to stripe-shaped diode anode layer segments 321, stripe-shaped life time control regions 91 and stripe-shaped diode cathode layer segments 331, on which they extend.

In vertical cross-section, each finger portion of the freewheeling diode 60 corresponding to each of the second, third and fourth finger portions 31b, 31c and 31e of the diode anode electrode 31 has the same structure as described above with reference to FIG. 5 for the finger portions of the freewheeling diode 60 which correspond to first finger portions 31a. The stripe-shaped diode anode layer segments 321 corresponding to the second finger portions 31b are referred to as second diode anode layer segments 321.

The thyristor cathode layers 51 of the plural thyristor cells 50 comprise plural thyristor cathode layer segments 511, which are stripe-shaped and separate from each other. On the thyristor cathode layer segments 511 corresponding finger portions of the thyristor cathode electrode 56 are formed. In top view the finger portions of the thyristor cathode electrode 56 have the same or a corresponding pattern and shape as the thyristor cathode layer segments 511.

As can be seen best from FIG. 3, in top view of the reverse conducting power semiconductor device, the thyristor cathode layer segments 511 are arranged at the first main side 21 as stripes placed in concentric rings around the lateral center of the semiconductor wafer 20, wherein a longitudinal main axis of each stripe extends along a radial direction (which is a direction extending from the lateral center of the semiconductor wafer 20 and parallel to the first main side 21). In each ring, the thyristor cathode layer segments 511 have the same distance to the lateral center of the semiconductor wafer 20. In the exemplary embodiment shown in FIG. 3, the thyristor cathode layer segments 511 may be placed in twelve concentric rings. However, the number of concentric rings may be any other number. Exemplarily, plural concentric rings are provided.

In an orthogonal projection onto a plane parallel to the second main side 22, in each of the concentric rings, groups of thyristor cathode layer segments 511 alternate with finger portions 31a to 31c, 31e. In the example shown in FIG. 3, in the first three inner concentric rings, in which the thyristor cathode layer segments 511 are arranged, groups of directly adjacent thyristor cathode layer segments 511 alternate only with first finger portions 31a along each ring, respectively. In the next three concentric rings, groups of directly adjacent thyristor cathode layer segments 511 alternate with first and second finger portions 31a and 31b along each ring, respectively.

Finally, in the next five concentric rings, in which the thyristor cathode layer segments 511 are arranged, groups of directly adjacent thyristor cathode layer segments 511 alternate with first, second and third finger portions 31a, 31b and 31c along each ring. In the outermost ring, in which thyristor cathode layer segments 511 are arranged, groups of respectively two directly adjacent thyristor cathode layer segments 511 alternate with first to fourth finger portions 31a, 31b, 31c and 31e along this outermost ring. In the top views of FIGS. 3 and 4 the finger portions of the thyristor cathode electrode 56 corresponding to the thyristor cathode layer segments 511 are shown as black stripes.

As can be seen best from FIGS. 3 and 4, in the first embodiment, the gate electrodes 55 of the plurality of thyristor cells 50 are electrically connected with each other, and the reverse conducting power semiconductor device further comprises a common gate contact 40 for contacting the gate electrodes 55 of the plurality of thyristor cells 50, wherein the common gate contact 40 is arranged on a circumferential edge of the semiconductor wafer 20 on the first main side 21. The first diode anode layer segments 321 extend in the radial direction through all of the concentric rings, in which the thyristor cathode layer segments 511 are arranged. In such exemplary embodiment the flow of gate current to (or from) a common gate contact 40 at the circumferential edge of the semiconductor wafer 20 from (or to) the thyristor cells 50 is not obstructed by the finger portions of the freewheeling diode corresponding to the stripe-shaped first diode anode layer segments 321. This facilitates in particular current commutation during turn-off.

Figure 9:
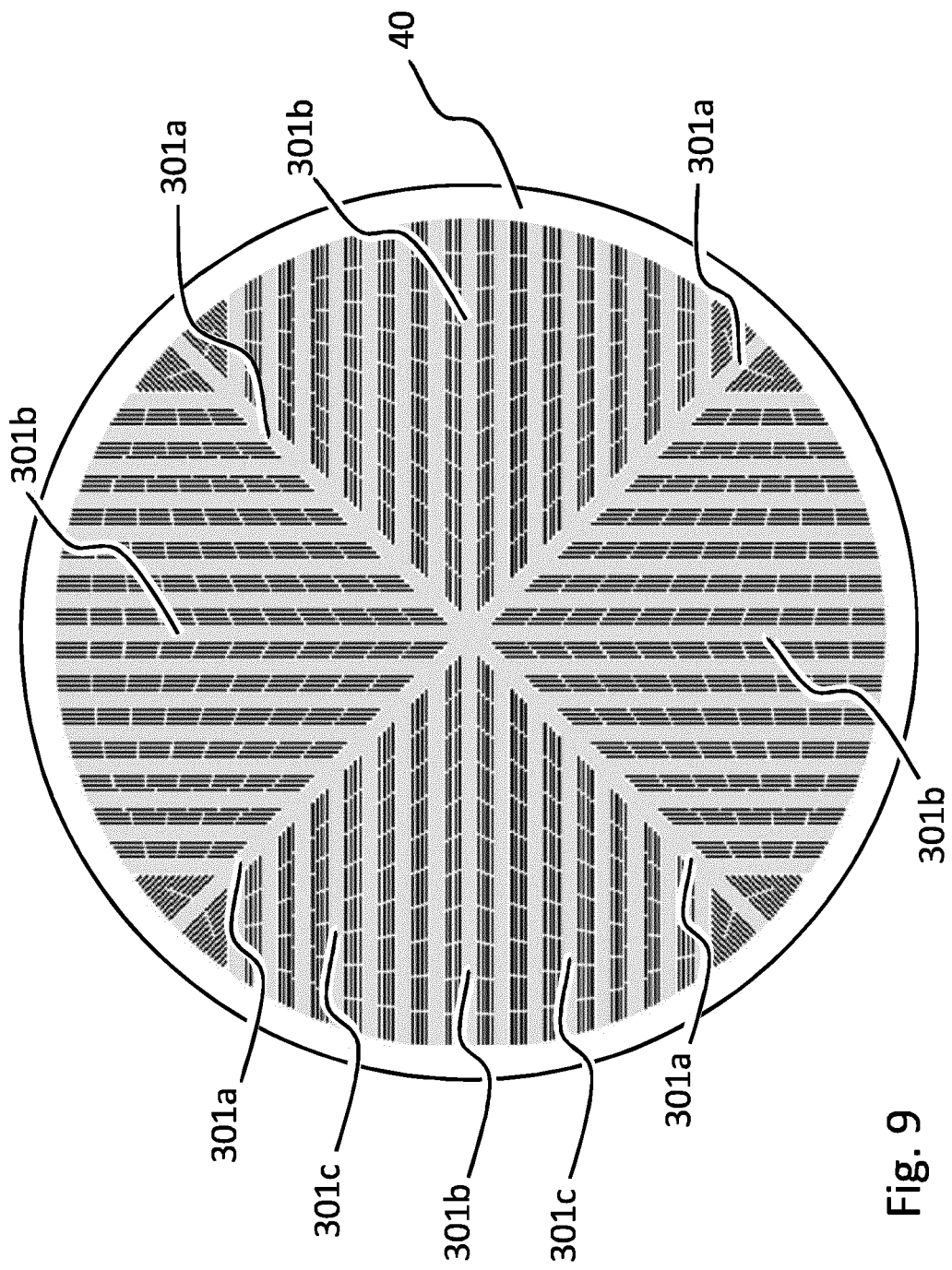
FIG. 9 shows a top view onto a reverse conducting power semiconductor device according to a second embodiment.

In FIG. 9 a top view of a reverse conducting power semiconductor according to a second embodiment of the invention is shown. In view of many similarities only differences to the first embodiment are described in the following. With regard to the remaining features it is referred to the above description of the first embodiment. In FIG. 9 the areas in light gray color correspond to areas of the diode anode electrode 31. Four first finger portions 301a and four second finger portions 301b of the diode anode electrode 31 extend from a lateral center of the semiconductor wafer 20 in a radial direction. Additional third finger portions 301c extend respectively from the four finger portions 301a in a direction away from a lateral center of semiconductor wafer 20. The first and second finger portions 301a and 301b are arranged with rotational symmetry.

Each of the finger portions 301a to 301c corresponds to a stripe-shaped portion of the freewheeling diode 60 and has a structure as shown in cross-section in FIG. 5 and as described above with reference to FIG. 5. The thyristor cells 50 in the reverse conducting power semiconductor device according to the second embodiment differ from the thyristor cells 50 in the first embodiment only in a different arrangement in top view. In the second embodiment the cathode layer segments 511 illustrated as black stripes in FIG. 9 are arranged along a longitudinal main axis of stripes laterally extending between directly adjacent finger portions 301b, 301c, respectively. That means the cathode layer segments 511 extend in a direction inclined to the radial direction. The structure of thyristor cells 50 of the reverse conducting power semiconductor device according to the second embodiment is basically the same as shown in cross-section in FIG. 5 and as described above with reference to FIG. 5.

Figure 7:
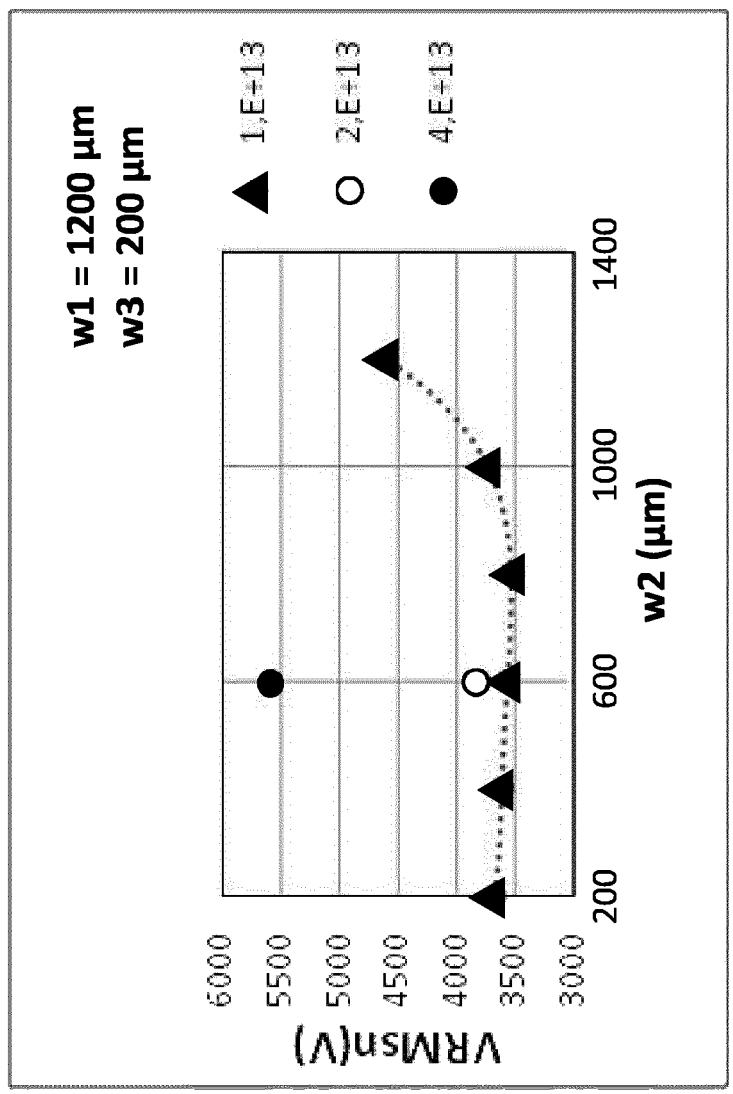
FIG. 7 shows a snap-off voltage peak of the reverse conducting power semiconductor device of FIG. 3 for different widths of the lifetime control region (proton irradiation width)
Figure 8:
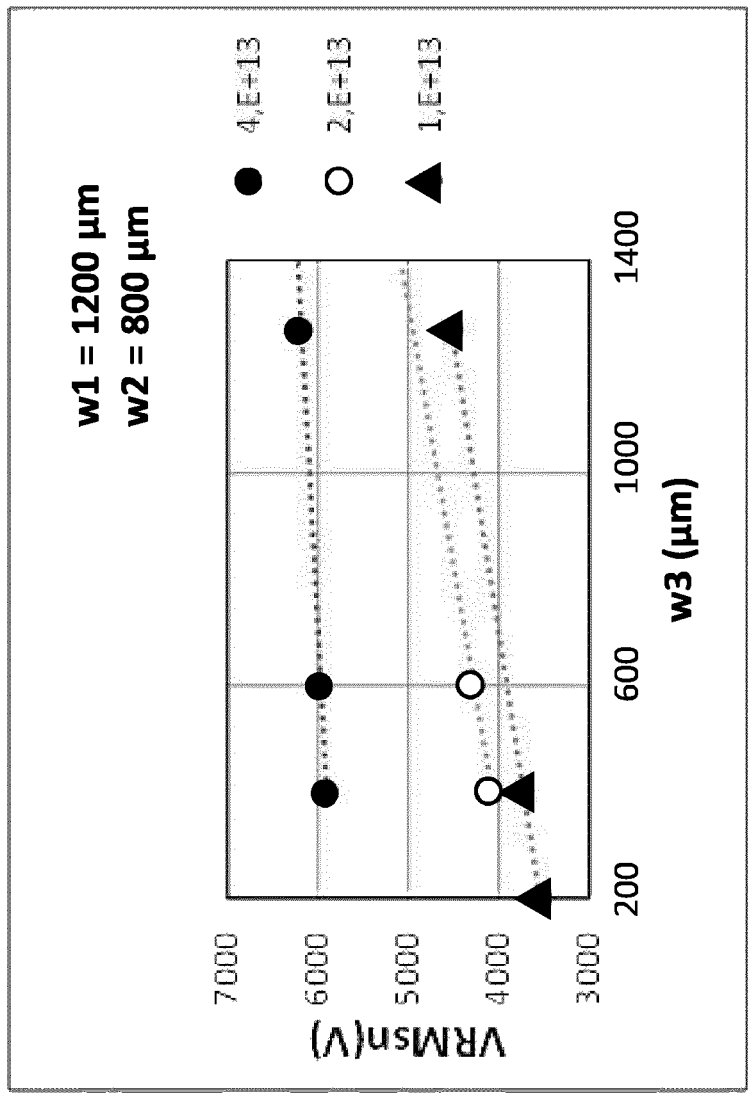
FIG. 8 shows a snap-off voltage peak of the reverse conducting power semiconductor device of FIG. 3 for different widths of diode cathode layer segments.

FIG. 7 shows a graph illustrating the dependency of the snap-off voltage VRMsn of the freewheeling diode 60 on the second lateral width w2 of the lifetime control region 91 for a stripe-shaped freewheeling diode 60 with a first lateral width w1 of 1200 µm and a third lateral width w3 of 200 µm. The different symbols, namely the triangle, the filled circle and the hollow circle correspond to a different proton irradiation dose, respectively (indicated as 1E+13, 2E+13 and 4E+14 in FIG. 7). At a second lateral width w2 of the lifetime control region of about w2=800 µm, the snap-off voltage VRMsn has its minimum and starts to increase again with increasing second lateral width w2. FIG. 8 shows a graph illustrating the dependency of the snap-off voltage on the third lateral width w3 for a freewheeling diode 60 with a first lateral width w1 of 1200 µm and a second lateral width w2 of 800 µm. As can be seen from FIG. 8 a decreasing third lateral width w3 results in a decreased snap-off voltage VRMsn.

In the following a method for manufacturing the reverse conducting power semiconductor device according to any of the above described embodiments is illustrated with reference to FIGS. 10A and 10B. The method comprises the following steps:

(a) providing an n-type semiconductor layer 200, the semiconductor layer 200 having a first side 201 and having a second side 202 opposite to the first side 201 and, wherein a doping concentration of the semiconductor layer 200 corresponds to the doping concentration of the drift layer 53 in the final reverse conducting power semiconductor device;

(b) providing a first mask layer 210 on the first side 201 of the semiconductor layer 200, the first mask layer 210 comprising first openings 211;

(c) selectively applying a p-type dopant 220 to the first side 201 of the semiconductor layer 200 through the first openings 211 of the first mask layer 210 for forming the base layers 52 and the diode anode layer 32 of the final reverse conducting semiconductor device;

(e) forming a second mask layer 240 on the first side 201, the second mask layer 240 having second openings 241;

(f) selectively applying radiation 250, such as electron or heavy ion radiation, onto the first side 201 through the second openings 241 in the second mask layer 240 for forming local lifetime control regions 91 including radiation induced recombination centers in the semiconductor layer 200;

(g) forming the thyristor cathode layer 51 on the first side 201;

(h) forming the thyristor anode layer 54 and the diode cathode electrode 36 on the second side 202; and (i) forming the diode cathode layer 33 on the second side 202;

The second openings 241 comprise stripe-shaped openings that are laterally aligned with regions of the semiconductor layer 200 in which the first diode anode layer segments 321 are to be formed such that, in an orthogonal projection onto a plane parallel to the first side 201, each second opening 241 is arranged within a projection area of a corresponding one of the first diode anode layer segments 321, the stripe-shaped openings 241 having a lateral width w4, which is at least at least 200 µm or at least 300 µm less than the lateral width w1 of a corresponding one of the first diode anode layer segments 321 at all positions along a longitudinal main axis MA of the corresponding one of the first diode anode layer segments 321 in the final reverse conducting power semiconductor device.

It will be apparent for persons skilled in the art that modifications of the above described embodiment are possible without departing from the idea of the invention as defined by the appended claims.

The above embodiments were explained with specific conductivity types. The conductivity types of the semiconductor layers in the above described embodiments might be switched, so that all layers which were described as p-type layers would be n-type layers and all layers which were described as n-type layers would be p-type layers.

The above embodiments of the reverse conducting power semiconductor device are described with a circular semiconductor wafer 20. However, the semiconductor wafer may have any other shape such as a rectangular or a polygon shape.

The method according to the embodiment described above with reference to FIGS. 10A and 10B, the different method steps were described in a certain order. However the method steps may be performed in a different order.

It should be noted that the term "comprising" does not exclude other elements or steps and that the indefinite article "a" or "an" does not exclude the plural. Also elements described in association with different embodiments may be combined.

The invention claimed is:

1. A reverse conducting power semiconductor device comprising:
 a semiconductor wafer having a first main side and a second main side opposite to the first main side;
 a plurality of local lifetime control regions comprising radiation induced recombination centers;
 a plurality of thyristor cells, each cell comprising a drift layer and a base layer; and
 a freewheeling diode comprising:
  a diode anode layer of a second conductivity type at the first main side, wherein a p-n junction is formed by the diode anode layer and the drift layer and wherein the diode anode layer is separated from the base layer by the drift layer;
  a diode anode electrode disposed at the first main side and electrically connected to the diode anode layer;
  a diode cathode layer of a first conductivity type opposite the second conductivity type disposed at the second main side and electrically connected to the drift layer; and
  a diode cathode electrode on the second main side, the diode cathode electrode forming an ohmic contact with the diode cathode layer;
 wherein the diode anode layer comprises a plurality of first diode anode layer segments that are stripe-shaped in an orthogonal projection onto a plane parallel to the second main side, a longitudinal main axis of each first diode anode layer segment extending in a lateral direction away from a lateral center of the semiconductor wafer, wherein lateral relates to a direction parallel to the second main side,
 wherein each first diode anode layer segment has a first lateral width in a direction perpendicular to its longitudinal main axis;
 wherein each local lifetime control region is arranged within a corresponding one of the first diode anode layer segments in the orthogonal projection such that a longitudinal main axis of each local lifetime control region extends along the longitudinal main axis of the corresponding one of the first diode anode layer segments;
 wherein each local lifetime control region has a second lateral width which is at least 200 µm less than the first lateral width of the corresponding one of the first diode anode layer segments;
 wherein the diode cathode layer comprises a plurality of diode cathode layer segments;
 wherein each diode cathode layer segment is stripe-shaped and arranged within a corresponding one of the stripe-shaped first diode anode layer segments in the orthogonal projection such that a longitudinal main axis of each diode cathode layer segment extends along the longitudinal main axis of the corresponding one of the first diode anode layer segments; and
 wherein each diode cathode layer segment has a third lateral width which is at least 200 µm less than the second lateral width of a corresponding one of the local lifetime control regions.

2. The device according to claim 1, wherein each of the plurality of thyristor cells comprises in an order from the first main side to the second main side:
 a thyristor cathode layer of the first conductivity type;
 the base layer of the second conductivity type, wherein a first p-n junction is formed between the base layer and the thyristor cathode layer;
 the drift layer of the first conductivity type, wherein a second p-n junction is formed between the base layer and the drift layer; and
 a thyristor anode layer of the second conductivity type separated from the base layer by the drift layer,
 a gate electrode arranged lateral to the thyristor cathode layer and forming an ohmic contact with the base layer;
 a thyristor cathode electrode arranged on the first main side and forming an ohmic contact with the thyristor cathode layer; and
 a thyristor anode electrode arranged on the second main side and forming an ohmic contact with the thyristor anode layer.

3. The device according to claim 2, wherein the semiconductor wafer has a circular shape and the longitudinal main axis of each first diode anode layer segment extends along a radial direction of the circular shape.

4. The device according to claim 2, wherein the first lateral width of each first diode anode layer segment is at any position along the longitudinal main axis less than 5000 µm.

5. The device according to claim 2, wherein the freewheeling diode has a circular-shaped portion arranged in the lateral center of the semiconductor wafer in the orthogonal projection onto the plane parallel to the second main side, and wherein each first diode anode layer segment laterally extends from the circular-shaped portion.

6. The device according to claim 2, wherein a length of each first diode anode layer segment in a direction along its longitudinal main axis is at least 20% of a width of the semiconductor wafer in this direction.

7. The device according to claim 2, wherein the diode anode layer comprises stripe-shaped second diode anode layer segments that extend along radial directions and that are arranged laterally between two adjacent first diode anode layer segments, respectively, a distance between each second diode anode layer segment and the lateral center of the semiconductor wafer being larger than a distance between each first diode anode layer segment and the lateral center of the semiconductor wafer.

8. The device according to claim 2, wherein a minimum of the first lateral width of each first diode anode layer segment is less than 2000 µm.

9. The device according to claim 2, wherein the third lateral width is at least 600 µm less than the first lateral width of the corresponding one of the first diode anode layer segments.

10. The device according to claim 2, wherein a depth of each base layer and a depth of the diode anode layer are the same.

11. The device according to claim 2, wherein the gate electrodes of the plurality of thyristor cells are electrically connected with each other and wherein the device further comprises a common gate contact for contacting the gate electrodes of the plurality of thyristor cells, the common gate contact being arranged on a circumferential edge of the semiconductor wafer on the first main side.

12. The device according to claim 2, wherein the thyristor cathode layer comprises a plurality of separate strip-shaped thyristor cathode layer segments that are at least partially surrounded in a plane parallel to the first main side by a gate metallization layer forming the gate electrodes and connections there between.

13. The device according to claim 12, wherein the thyristor cathode layer segments of the plurality of thyristor cells are arranged at the first main side as stripes placed in concentric rings around the lateral center of the semiconductor wafer, a longitudinal main axis of each stripe extending along a radial direction which is a direction extending from the lateral center of the semiconductor wafer and parallel to the first main side.

14. The device according to claim 2, wherein the thyristor cathode electrodes are adjacent to and extend parallel to the stripe-shaped diode anode segments.

15. A reverse conducting power semiconductor device comprising:
  a semiconductor wafer having a first main side and a second main side opposite to the first main side;
  a plurality of thyristor cells;
  a freewheeling diode; and
  a plurality of local lifetime control regions including radiation induced recombination centers;
  wherein each of the plurality of thyristor cells comprises, in an order from the first main side to the second main side:
    a thyristor cathode layer of a first conductivity type;
    a base layer of a second conductivity type different from the first conductivity type, wherein a first p-n junction is formed between the base layer and the thyristor cathode layer;
    a drift layer of the first conductivity type forming a second p-n junction with the base layer;
    a thyristor anode layer of the second conductivity type separated from the base layer by the drift layer;
    a gate electrode arranged lateral to the thyristor cathode layer and forming an ohmic contact with the base layer;
    a thyristor cathode electrode arranged on the first main side and forming an ohmic contact with the thyristor cathode layer; and
    a thyristor anode electrode arranged on the second main side and forming an ohmic contact with the thyristor anode layer;
  wherein the freewheeling diode comprises:
    a diode anode layer of the second conductivity type disposed at the first main side, the diode anode layer forming a third p-n junction with the drift layer and being separated from the base layer by the drift layer;
    a diode anode electrode disposed at the first main side and electrically connected to the diode anode layer;
    a diode cathode layer of the first conductivity type disposed at the second main side, the diode cathode layer being electrically connected to the drift layer; and
    a diode cathode electrode disposed on the second main side and forming an ohmic contact with the diode cathode layer;
  wherein the diode anode layer comprises a plurality of first diode anode layer segments that are stripe-shaped in an orthogonal projection onto a plane parallel to the second main side, a longitudinal main axis of each first diode anode layer segment extending in a lateral direction away from a lateral center of the semiconductor wafer, wherein lateral relates to a direction parallel to the second main side;
  wherein each first diode anode layer segment has a first lateral width in a direction perpendicular to its longitudinal main axis;
  wherein each local lifetime control region is stripe-shaped and arranged within a corresponding one of the first diode anode layer segments in the orthogonal projection such that a longitudinal main axis of each local lifetime control region extends along the longitudinal main axis of the corresponding one of the first diode anode layer segments;
  wherein each local lifetime control region has a second lateral width that is at least 300 µm less than the first lateral width of the corresponding one of the first diode anode layer segments;
  wherein the diode cathode layer comprises a plurality of diode cathode layer segments;
  wherein each diode cathode layer segment is stripe-shaped and arranged within a corresponding one of the stripe-shaped first diode anode layer segments in the orthogonal projection such that a longitudinal main axis of each diode cathode layer segment extends along the longitudinal main axis of the corresponding one of the first diode anode layer segments; and
  wherein each diode cathode layer segment has a third lateral width that is at least 300 µm less than the second lateral width of a corresponding one of the local lifetime control regions.

16. The device according to claim 15, wherein the semiconductor wafer has a circular shape and the longitudinal main axis of each first diode anode layer segment extends along a radial direction of the circular shape.

17. The device according to claim 15, wherein the first lateral width of each first diode anode layer segment is at any position along the longitudinal main axis less than 3000 µm.

18. The device according to claim 15, wherein the freewheeling diode has a circular-shaped portion arranged in the lateral center of the semiconductor wafer in the orthogonal projection onto the plane parallel to the second main side, wherein each first diode anode layer segment laterally extends from the circular-shaped portion.

19. A method for manufacturing the device according to claim 15, the method comprising:
  selectively applying a dopant of the second conductivity type to the first main side of the semiconductor wafer to form the base layers and the diode anode layer;
  selectively applying radiation onto the first main side to form the local lifetime control regions;
  forming the thyristor cathode layer on the first main side;
  forming the thyristor anode layer and the diode cathode electrode on the second side; and
  forming the diode cathode layer on the second side.

20. A method for manufacturing a reverse conducting power semiconductor device that includes a plurality of thyristors and a freewheeling diode, the method comprising:
  providing a semiconductor layer of a first conductivity type, the semiconductor layer having a first side and a second side opposite to the first side, wherein a doping concentration of the semiconductor layer corresponds to a doping concentration of a drift layer in the reverse conducting power semiconductor device;
  providing a first mask layer on the first side of the semiconductor layer, the first mask layer comprising first openings;

selectively applying a dopant of a second conductivity type to the first side of the semiconductor layer through the first openings of the first mask layer for forming base layers and a diode anode layer of the freewheeling diode;

forming a second mask layer on the first side, the second mask layer having second openings;

selectively applying radiation onto the first side through the second openings in the second mask layer for forming local lifetime control regions including radiation induced recombination centers in the semiconductor layer;

forming a thyristor cathode layer on the first side;

forming a thyristor anode layer and a diode cathode electrode on the second side; and forming a diode cathode layer on the second side;

wherein the second openings comprise stripe-shaped openings that are laterally aligned with regions of the semiconductor layer in which first diode anode layer segments are formed such that, in an orthogonal projection onto a plane parallel to the first side, each second opening is arranged within a projection area of a corresponding one of the first diode anode layer segments, the stripe-shaped openings having a lateral width that is at least 200 μm less than a first lateral width of a corresponding one of the first diode anode layer segments at all positions along a longitudinal main axis of the corresponding one of the first diode anode layer segments.

* * * * *